(12) United States Patent
Ikeuchi et al.

(10) Patent No.: US 9,257,962 B2
(45) Date of Patent: Feb. 9, 2016

(54) ELASTIC WAVE DEVICE

(71) Applicant: SKYWORKS PANASONIC FILTER SOLUTIONS JAPAN CO., LTD., Kadoma-Shi (JP)

(72) Inventors: Satoru Ikeuchi, Hyogo-Ken (JP); Kazunori Nishimura, Kyoto-Fu (JP)

(73) Assignee: SKYWORKS PANASONIC FILTER SOLUTIONS JAPAN CO., LTD., Kadoma-Shi (JP)

( * ) Notice: Subject to any disclaimer, the term of this patent is extended or adjusted under 35 U.S.C. 154(b) by 318 days.

(21) Appl. No.: 13/823,760

(22) PCT Filed: Oct. 30, 2012

(86) PCT No.: PCT/JP2012/006945
§ 371 (c)(1),
(2) Date: Mar. 15, 2013

(87) PCT Pub. No.: WO2013/069225
PCT Pub. Date: May 16, 2013

(65) Prior Publication Data
US 2014/0070906 A1    Mar. 13, 2014

(30) Foreign Application Priority Data
Nov. 10, 2011    (JP) .................................. 2011-246051

(51) Int. Cl.
*H03H 9/64*    (2006.01)
*H01L 41/047*    (2006.01)
(Continued)

(52) U.S. Cl.
CPC ............. *H03H 9/643* (2013.01); *H01L 41/047* (2013.01); *H03H 9/0038* (2013.01); *H03H 9/02748* (2013.01); *H03H 9/02755* (2013.01)

(58) Field of Classification Search
CPC . H03H 9/0038; H03H 9/643; H03H 9/02748; H03H 9/02755; H03H 9/64; H01L 41/047
USPC ....... 333/25, 133, 193–196; 310/313 B, 313 D
See application file for complete search history.

(56) References Cited

U.S. PATENT DOCUMENTS

| 6,717,489 B2 | 4/2004 | Takamine |
| 6,853,270 B2 | 2/2005 | Shibahara |

(Continued)

FOREIGN PATENT DOCUMENTS

| JP | 2002-111432 | 4/2002 |
| JP | 2004-088551 | 3/2004 |

(Continued)

OTHER PUBLICATIONS

Japanese version of International Search Report of PCT/JP2012/006945, mailed on Jan. 15, 2013.

*Primary Examiner* — Benny Lee
*Assistant Examiner* — Jorge Salazar, Jr.
(74) *Attorney, Agent, or Firm* — Lando & Anastasi, LLP

(57) ABSTRACT

An elastic wave device includes a piezoelectric substrate, a pair of reflectors disposed on the piezoelectric substrate along the propagation direction of an elastic wave, and first to fifth comb electrode pairs disposed in this order between the pair of reflectors. Ground comb electrodes of adjacent comb electrode pairs are connected by an even number of connection electrode fingers or by an odd number of connection electrode fingers.

23 Claims, 7 Drawing Sheets

(51) Int. Cl.
  *H03H 9/00*  (2006.01)
  *H03H 9/02*  (2006.01)

(56) References Cited

U.S. PATENT DOCUMENTS

| 7,369,016 | B2 | 5/2008 | Takamine |
| 2004/0066115 | A1 | 4/2004 | Takamine |
| 2007/0279157 | A1 | 12/2007 | Bauer |
| 2010/0259341 | A1 | 10/2010 | Nakai |
| 2012/0262246 | A1 | 10/2012 | Yasuda |

FOREIGN PATENT DOCUMENTS

| JP | 2004-140785 | 5/2004 |
| JP | 2010-251964 | 11/2010 |
| WO | 2005-107065 | 11/2005 |
| WO | 2009-001651 | 12/2008 |

# ELASTIC WAVE DEVICE

TECHNICAL FIELD

The present invention relates to an elastic wave device used mainly in a mobile communication device or the like.

BACKGROUND ART

In recent years, there is a significant technological advance in miniaturization and weight savings of communication devices such as mobile phones and the like. As a filter used in such a communication device, there is used an elastic wave device which can be miniaturized, such as a surface acoustic wave device or an elastic boundary wave device. Moreover, an elastic wave device having an unbalanced-to-balanced function, i.e., a so-called balun function, is used in many cases as an elastic wave device for an RF (radio frequency) circuit of a mobile phone. Such an elastic wave device having an unbalanced-to-balanced function preferably has a good balance.

Herein, the balance is an index indicating the degree of idealness of an electric signal output from a balanced terminal of the elastic wave device having the unbalanced-to-balanced function in terms of opposite phase and same amplitude. The balance is expressed by two amounts, an amplitude balance and a phase balance. The amplitude balance is an amplitude ratio between two balanced signals, and its ideal value is 0 [dB]. The phase balance is a value obtained by subtracting 180° from a phase difference between two balanced signals, and its ideal value is 0°. As another evaluation method for balances, there is a common mode characteristic. If an ideal balance is achieved, signals between balanced terminals are completely cancelled. Therefore, the balance is good when an output signal is as small as possible (greatly attenuated) according to the transmission characteristics of the common mode characteristic. Thus, the common mode characteristic is an index for comprehensively evaluating the balance using the amplitude balance and the phase balance.

As the elastic wave device having the unbalanced-to-balanced function, a three-electrode longitudinally coupled elastic wave filter having three comb electrode pairs is used in many cases. With the three-electrode longitudinally coupled elastic wave filter, a standing wave with asymmetrical displacement distribution of an excited surface wave is formed. Accordingly, a current flowing through a comb electrode pair also becomes asymmetrical, and there is a problem regarding the balance. Efforts are being made to overcome the problem of such a three-electrode longitudinally coupled elastic wave filter. For example, a region where an electrode finger pitch is small is provided at a portion of adjacent comb electrode pairs in the three-electrode longitudinally coupled elastic wave filter. Further, the electrode finger pitch is made different for left and right for the region where the electrode finger pitch is made small. In this manner, a technique regarding asymmetrical design and a technique regarding weighting are being proposed.

Furthermore, it is preferable that an insertion loss of a filter used for an RF unit of a mobile phone is made as small as possible. As a technique of reducing the insertion loss, there is proposed a technique of reducing the loss by comb electrode resistance by connecting the three-electrode longitudinally coupled elastic wave filters in parallel, for example.

As cited references related to the invention of this application, Patent Literature 1 and Patent Literature 2 are known, for example.

CITATION LIST

Patent Literature

PTL 1: Unexamined Japanese Patent Publication No. 2002-111432
PTL 2: Unexamined Japanese Patent Publication No. 2004-140785

SUMMARY OF THE INVENTION

An elastic wave device according to the present invention includes a piezoelectric substrate, a pair of reflectors, and first to fifth comb electrode pairs. The pair of reflectors is disposed on the piezoelectric substrate along a propagation direction of an elastic wave. The first to fifth comb electrode pairs are disposed in this order between the pair of reflectors. A part where the first comb electrode pair and the second comb electrode pair are adjacent to each other is a first adjacence portion, and a part where the second comb electrode pair and the third comb electrode pair are adjacent to each other is a second adjacence portion. A part where the third comb electrode pair and the fourth comb electrode pair are adjacent to each other is a third adjacence portion, and a part where the fourth comb electrode pair and the fifth comb electrode pair are adjacent to each other is a fourth adjacence portion. Each of the first to fifth comb electrode pairs has a signal comb electrode and a ground comb electrode facing each other. In the structure described above, the elastic wave device according to the present invention further includes any of the structures below.

(1) The signal comb electrode of the first comb electrode pair, the signal comb electrode of the third comb electrode pair, and the signal comb electrode of the fifth comb electrode pair are connected together in parallel, and connected to an unbalanced signal terminal. The signal comb electrode of the second comb electrode pair is connected to a first balanced signal terminal, and the signal comb electrode of the fourth comb electrode pair is connected to a second balanced signal terminal. The ground comb electrodes of the first to fifth comb electrode pairs are connected to a ground electrode. At least one of a first connection electrode finger connecting the ground comb electrode of the first comb electrode pair to the ground comb electrode of the second comb electrode pair at the first adjacence portion, and a second connection electrode finger connecting the ground comb electrode of the second comb electrode pair to the ground comb electrode of the third comb electrode pair at the second adjacence portion is further provided. Also, at least one of a third connection electrode finger connecting the ground comb electrode of the third comb electrode pair to the ground comb electrode of the fourth comb electrode pair at the third adjacence portion, and a fourth connection electrode finger connecting the ground comb electrode of the fourth comb electrode pair to the ground comb electrode of the fifth comb electrode pair at the fourth adjacence portion is further provided. Furthermore, at least one of the first connection electrode finger and the second connection electrode finger is formed from an even number of electrode fingers, and at least one of the third connection electrode finger and the fourth connection electrode finger is formed from an odd number of electrode fingers.

(2) The signal comb electrode of the second comb electrode pair and the signal comb electrode of the fourth comb electrode pair are connected together in parallel, and connected to an unbalanced signal terminal. The signal comb electrode of the third comb electrode pair is divided into a first region and a second region along the propagation direction of an elastic wave. A ground comb electrode of the first region and a ground comb electrode of the second region of the third comb electrode pair are electrically connected together in series via a series connection point. A signal comb electrode of the first region of the third comb electrode pair is connected in parallel to the signal comb electrode of the first comb electrode pair, and connected to a first balanced signal terminal. A signal comb electrode of the second region of the third comb electrode pair is connected in parallel to the signal comb electrode of the fifth comb electrode pair, and connected to a second balanced signal terminal. The ground comb electrodes of the first to fifth comb electrode pairs are each connected to a ground electrode. At least one of a first connection electrode finger connecting the ground comb electrode of the first comb electrode pair to the ground comb electrode of the second comb electrode pair at the first adjacence portion, and a second connection electrode finger connecting the ground comb electrode of the second comb electrode pair to the ground comb electrode of the third comb electrode pair at the second adjacence portion is further provided. At least one of a third connection electrode finger connecting the ground comb electrode of the third comb electrode pair to the ground comb electrode of the fourth comb electrode pair at the third adjacence portion, and a fourth connection electrode finger connecting the ground comb electrode of the fourth comb electrode pair to the ground comb electrode of the fifth comb electrode pair at the fourth adjacence portion is further provided. At least one of the first connection electrode finger and the second connection electrode finger is formed from an even number of electrode fingers, and at least one of the third connection electrode finger and the fourth connection electrode finger is formed from an odd number of electrode fingers.

According to any of the structures above, a small elastic wave device with a low loss and a good balance may easily be manufactured.

DESCRIPTION OF EMBODIMENTS

Prior to describing the embodiments of the present invention, problems of a conventional elastic wave device will be described. To further miniaturize an elastic wave device and to reduce a loss, it is more desirable to increase the number of electrodes to five or more comb electrode pairs than to connect three-electrode elastic wave filters in parallel in terms of area efficiency. However, in the case of an elastic wave device having an unbalanced-to-balanced function with five or more comb electrode pairs, the comb electrode pairs are adjacent to one another in many parts, and a structure of making the electrode finger pitches of adjacence portions different for each adjacence portion increases the design parameters, thus making designing difficult. Moreover, the increase in the number of parts with different electrode finger pitches makes it difficult for electrode finger width to be in accordance with the design. As a result, it takes a long time to improve the balance with repetition of manufacturing of exposure masks by trial and error, for example. Also, in the case of applying another conventional technique of weighting a part where comb electrode pairs are adjacent to each other, since a multi-electrode elastic wave device includes many parts where the comb electrode pairs are adjacent to one another, the loss is not sufficiently reduced due to a weighting loss.

In the following, elastic wave devices according to the embodiments of the present invention will be described with reference to the drawings.

First Exemplary Embodiment

Figure 1:
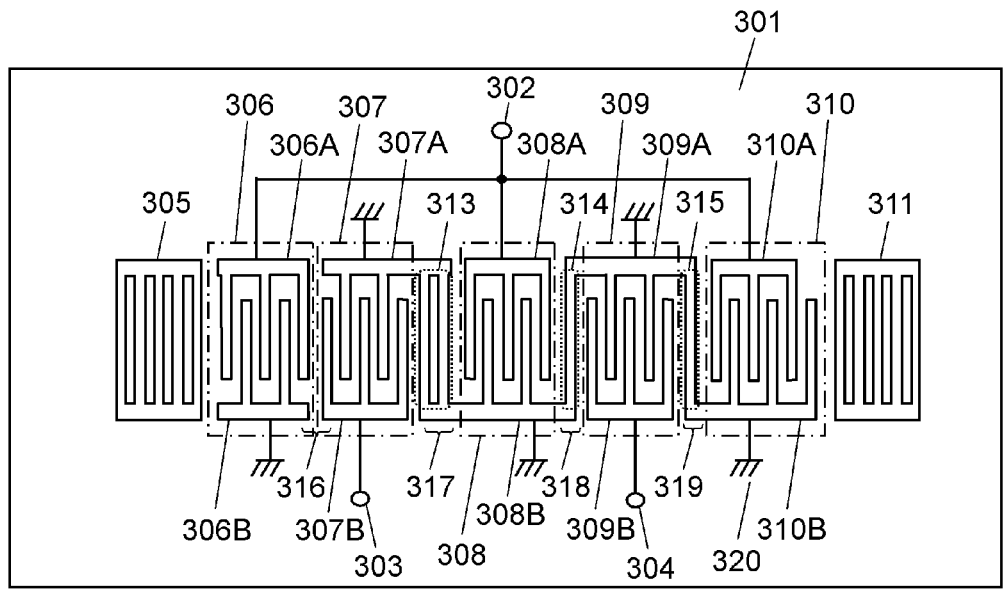
FIG. 1 is a plan view of an elastic wave device of a first exemplary embodiment of the present invention.

FIG. 1 is a plan view of an elastic wave device according to a first exemplary embodiment of the present invention. The elastic wave device includes piezoelectric substrate 301, reflector 305, first comb electrode pair 306, second comb electrode pair 307, third comb electrode pair 308, fourth comb electrode pair 309, fifth comb electrode pair 310, and reflector 311. Reflector 305, first comb electrode pair 306, second comb electrode pair 307, third comb electrode pair 308, fourth comb electrode pair 309, fifth comb electrode pair 310, and reflector 311 are arranged in this order on a main surface of piezoelectric substrate 301 along a propagation direction of an elastic wave. That is, reflectors 305 and 311 are disposed on piezoelectric substrate 301 along the propagation direction of the elastic wave, and first comb electrode pair 306 to fifth comb electrode pair 310 are disposed in this order between reflectors 305 and 311. This elastic wave device is a five-electrode longitudinally coupled elastic wave filter having an unbalanced-to-balanced function.

First comb electrode pair 306 to fifth comb electrode pair 310 are formed from signal comb electrodes 306A, 307B, 308A, 309B, and 310A and ground comb electrodes 306B, 307A, 308B, 309A, and 310B facing one another, respectively. A part where first comb electrode pair 306 and second comb electrode pair 307 are adjacent to each other is first adjacence portion 316. A part where second comb electrode pair 307 and third comb electrode pair 308 are adjacent to each other is second adjacence portion 317. A part where third comb electrode pair 308 and fourth comb electrode pair 309 are adjacent to each other is third adjacence portion 318. A part where fourth comb electrode pair 309 and fifth comb electrode pair 310 are adjacent to each other is fourth adjacence portion 319.

Signal comb electrodes 306A, 308A, and 310A are connected in parallel, and also connected to unbalanced signal terminal 302. Signal comb electrode 307B is connected to first balanced signal terminal 303, and signal comb electrode 309B is connected to second balanced signal terminal 304. Ground comb electrodes 306B, 307A, 308B, 309A, and 310B of first comb electrode pair 306 to fifth comb electrode pair 310 are connected to ground electrode 320.

At first adjacence portion 316, ground comb electrode 306B and ground comb electrode 307A are not electrically connected. That is, a connection electrode finger for electrically connecting ground comb electrode 306B to ground comb electrode 307A is not provided. Also, signal comb electrode 306A and signal comb electrode 307B are adjacent to each other.

At second adjacence portion 317, two connection electrode fingers 313 electrically connecting ground comb electrode 307A to ground comb electrode 308B are provided. At third adjacence portion 318, one connection electrode finger 314 electrically connecting ground comb electrode 308B to ground comb electrode 309A is provided. At fourth adjacence portion 319, one connection electrode finger 315 electrically connecting ground comb electrode 309A to ground comb electrode 310B is provided.

With the structure described above, left-right asymmetry of displacement distribution of an excited elastic wave can be reduced, and as a result, the symmetry of distribution of current flowing through the comb electrodes is increased. A good balance is thereby obtained for the elastic wave device.

Furthermore, it is preferable that the total number of connection electrode fingers at first adjacence portion 316 second adjacence portion 317, and the total number of connection electrode fingers at third adjacence portion 318 and fourth adjacence portion 319 are the same. In the present exemplary embodiment, the number of connection electrode fingers is zero in first adjacence portion 316, two in second adjacence portion 317, and one in each of third adjacence portion 318 and fourth adjacence portion 319. With this structure, a good balance is obtained for the elastic wave device at a wide range of transmission band.

The transmission band of the elastic wave device ranges from 1880 MHz to 1920 MHz. A rotated Y-cut X-propagation lithium tantalate single crystal is used as piezoelectric substrate 301, and the number of electrode fingers is 70 for reflector 305, 36 (18 pairs) for first comb electrode pair 306, 46 (23 pairs) for second comb electrode pair 307, 60 (30 pairs) for third comb electrode pair 308, 46 (23 pairs) for fourth comb electrode pair 309, 36 (18 pairs) for fifth comb electrode pair 310, and 70 for reflector 311.

Figure 2:
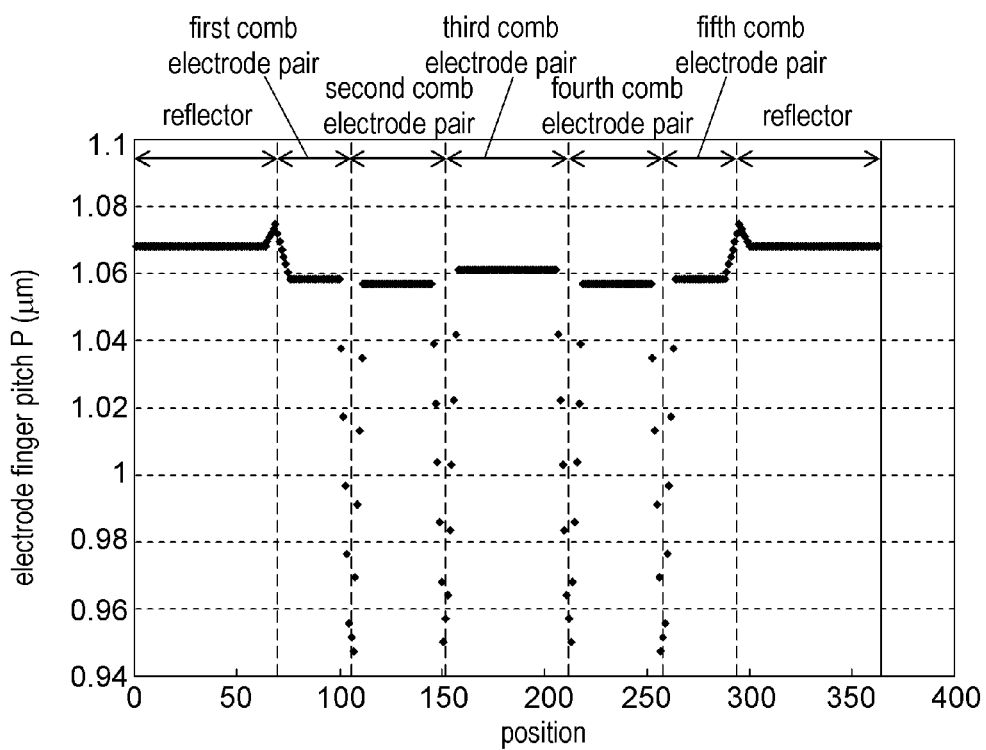
FIG. 2 is a distribution diagram of electrode finger pitches of the elastic wave device shown in FIG. 1.

The distribution of electrode finger pitches is as shown in FIG. 2, and the distribution of electrode finger pitches is preferably line symmetrical with respect to the center of third comb electrode pair 308. That is, the electrode finger pitches of first comb electrode pair 306 to fifth comb electrode pair 310 are preferably line symmetrical in the propagation direction of an elastic wave with respect to the center of third comb electrode pair 308 as an axis.

The horizontal axis in FIG. 2 shows electrode finger pitch numbers assigned to the electrode finger pitches in the order from left to right, where the number of the electrode finger pitch between the left end of reflector 305 and the electrode finger on its right is one. That is, the numbers are assigned to the electrode finger pitches sequentially for first comb electrode pair 306, second comb electrode pair 307, third comb electrode pair 308, fourth comb electrode pair 309, fifth comb electrode pair 310, and reflector 311. The vertical axis shows the width of each of the electrode finger pitches.

Figure 3:
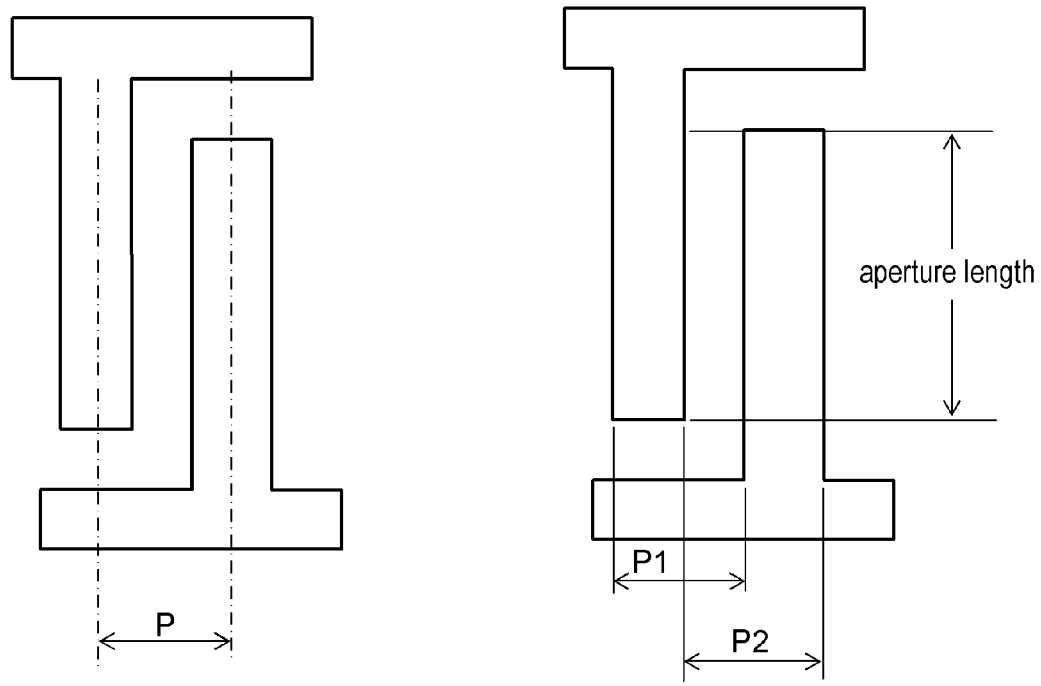
FIG. 3 is a diagram showing a measurement method of an electrode finger pitch of the elastic wave device shown in FIG. 1.

As shown in FIG. 3, the electrode finger pitch is defined by a distance between the centers of comb electrodes that are adjacent to each other in the propagation direction of an elastic wave. When performing actual measurement, the electrode finger pitch is obtained by a weighted average P=(P1+P2)/2 of a distance P1 between the same ends of the adjacent comb electrodes and a distance P2 between the other ends. The electrode finger pitches of equal pitch portions of reflectors 305 and 311 are 1.0681 μm. The electrode finger pitches of equal pitch portions of first comb electrode pair 306 and fifth comb electrode pair 310 are 1.0582 μm. The electrode finger pitches of equal pitch portions of second comb electrode pair 307 and fourth comb electrode pair 309 are 1.0569 μm. The electrode finger pitches of equal pitch portion of third comb electrode pair 308 are 1.0612 μm. The electrode finger pitches of first adjacence portion 316 are varied such that the minimum electrode finger pitch is 0.9474 μm. The electrode finger pitches of second adjacence portion 317 are varied such that the minimum electrode finger pitch is 0.9503 μm. The electrode finger pitches of third adjacence portion 318 are structured to be symmetrical to those of second adjacence portion 317. The electrode finger pitches of fourth adjacence portion 319 are structured to be symmetrical to those of first adjacence portion 316.

The electrode finger pitches at the adjacence portion of reflector 305 and first comb electrode pair 306 are varied such that the maximum electrode finger pitch is 1.0748 μm. That is, the electrode finger pitches of first comb electrode pair 306 adjacent to reflector 305 are larger on the side closer to reflector 305, and become smaller toward the equal pitch portion of first comb electrode pair 306. According to this structure, the insertion loss is small at a lower part of the transmission band.

At the adjacence portion of reflector 311 and fifth comb electrode pair 310, the electrode finger pitches are made symmetrical to those of the adjacence portion of reflector 305 and first comb electrode pair 306. That is, the electrode finger pitches are varied such that the maximum electrode finger pitch is 1.0748 μm. Also, the electrode finger pitches of fifth comb electrode pair 310 adjacent to reflector 311 are larger on the side closer to reflector 311, and become smaller toward the equal pitch portion of fifth comb electrode pair 310. According to this structure, the insertion loss is small at a lower part of the transmission band.

Figure 4:
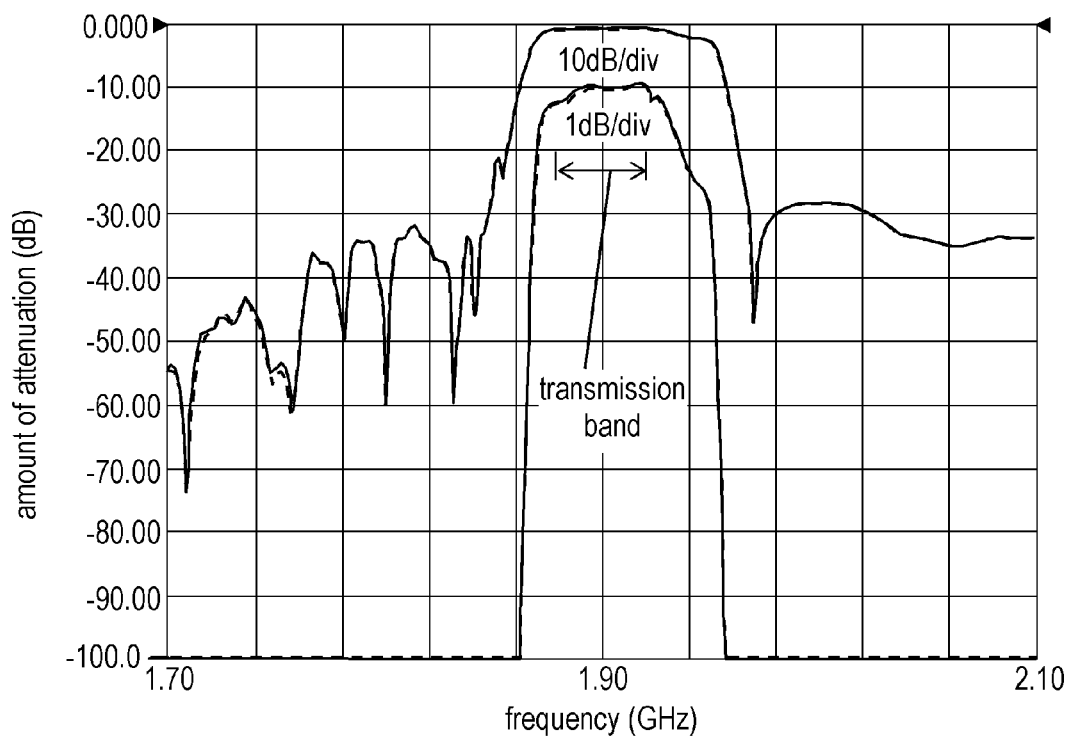
FIG. 4 is a transmission characteristic diagram of the elastic wave device shown in FIG. 1.
Figure 5:
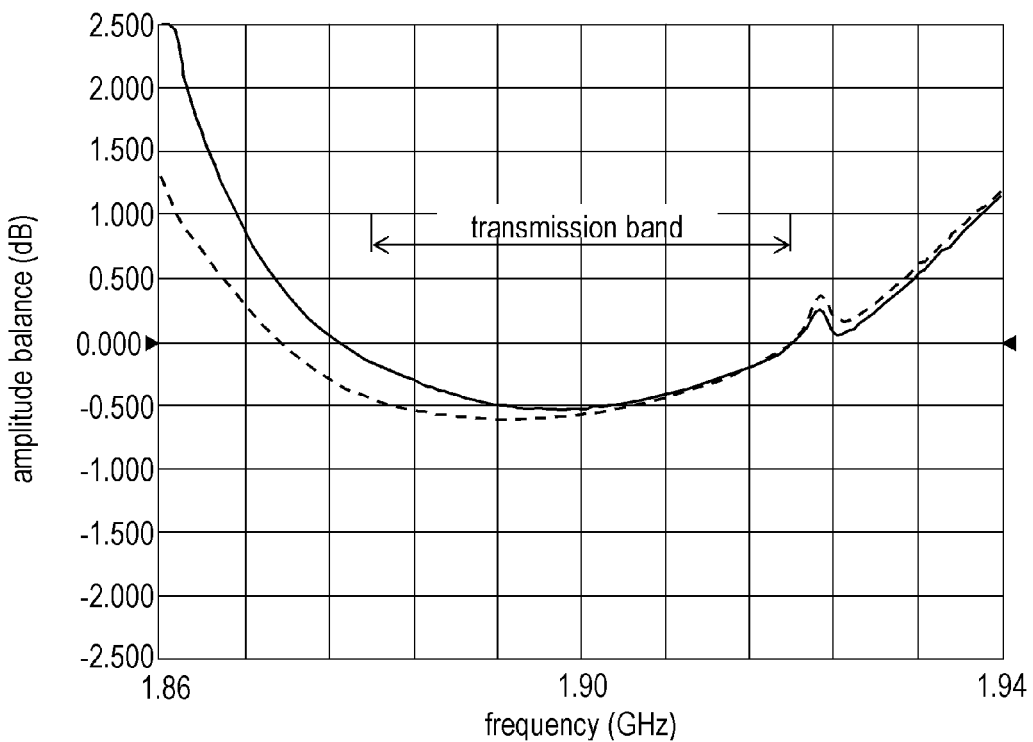
FIG. 5 is a diagram showing an amplitude balance of the elastic wave device shown in FIG. 1.
Figure 6:
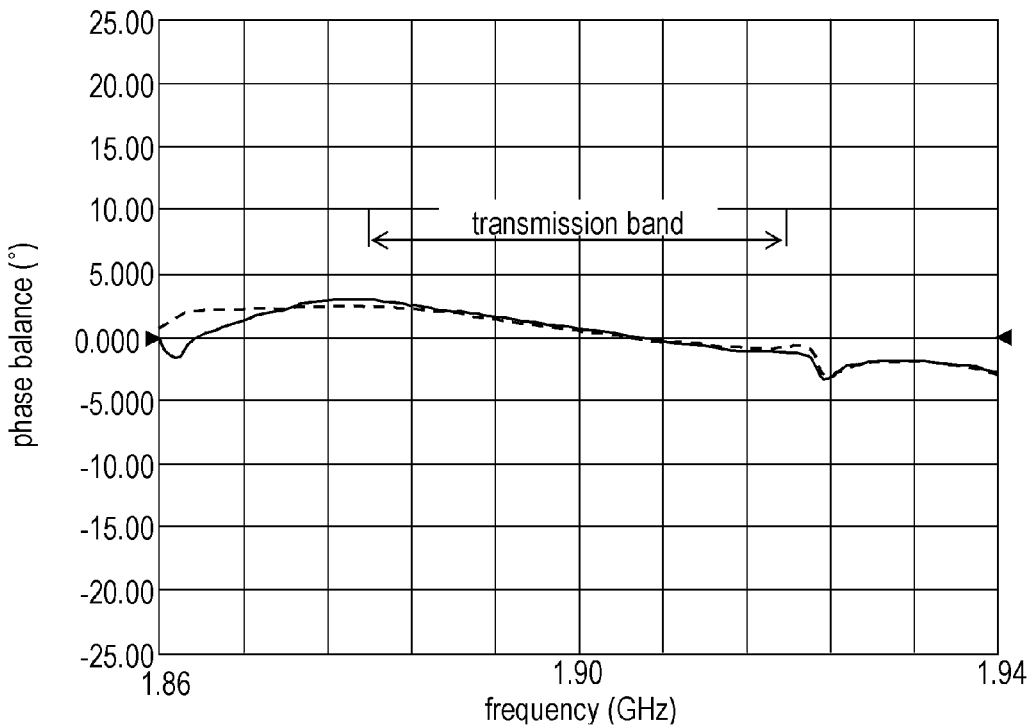
FIG. 6 is a diagram showing a phase balance of the elastic wave device shown in FIG. 1.
Figure 7:
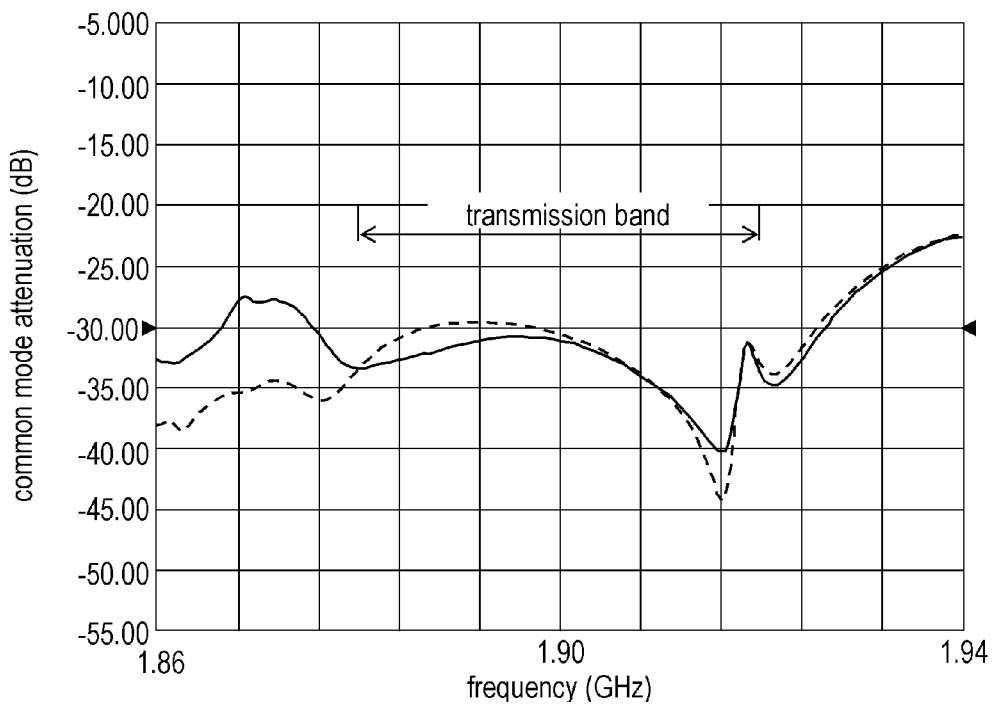
FIG. 7 is a diagram showing a common mode characteristic curve of the elastic wave device shown in FIG. 1.

The transmission characteristics of the elastic wave device of the present exemplary embodiment are shown in FIG. 4, the amplitude balance is shown in FIG. 5, the phase balance is shown in FIG. 6, and the common mode characteristic curve is shown in FIG. 7. In FIGS. 4 to 7, solid lines show the characteristics of the elastic wave device of the present exemplary embodiment, and broken lines show characteristics of an elastic wave device of a comparative example.

Figure 13:
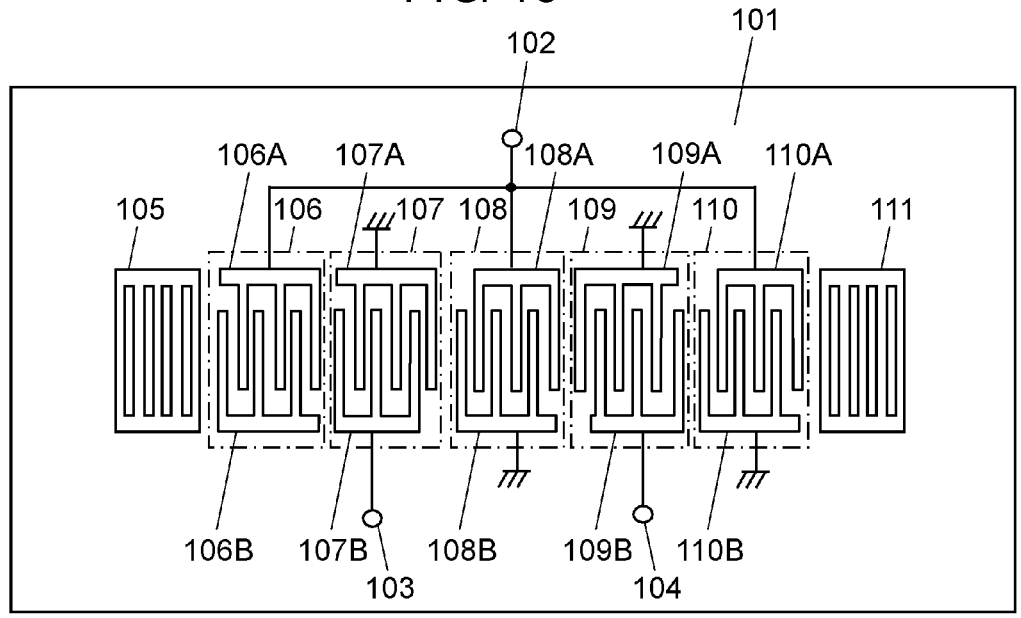
FIG. 13 is a plan view of an elastic wave device of a comparative example without connection electrode fingers.

As shown in FIG. 13, in the elastic wave device of a comparative example, reflector 105, first to fifth comb electrode pairs 106, 107, 108, 109, and 110, and reflector 111 are arranged in this order on a main surface of piezoelectric substrate 101 along the propagation direction of an elastic wave. Comb electrode pairs 106, 107, 108, 109, and 110 are connected to unbalanced signal terminal 102, first balanced signal terminal 103, or second balanced signal terminal 104. As thus described, the elastic wave device of the comparative example is a five-electrode longitudinally coupled elastic wave filter having an unbalanced-to-balanced function. At an adjacence portion between first comb electrode pair 106 and second comb electrode pair 107, a connection electrode finger for connecting first comb electrode pair 106 to second comb electrode pair 107 is not provided. Likewise, at an adjacence portion between second comb electrode pair 107 and third comb electrode pair 108, a connection electrode finger for connecting second comb electrode pair 107 to third comb electrode pair 108 is not provided. At an adjacence portion between third comb electrode pair 108 and fourth comb electrode pair 109, a connection electrode finger for connecting third comb electrode pair 108 to fourth comb electrode pair 109 is not provided. At an adjacence portion between fourth comb electrode pair 109 and fifth comb electrode pair 110, a connection electrode finger for connecting fourth comb electrode pair 109 to fifth comb electrode pair 110 is not provided.

As shown in FIG. 4, it can be seen that the insertion loss of the elastic wave device according to the present exemplary embodiment is better (less) than that of the elastic wave device of the comparative example by about 0.15 dB, when compared based on frequencies ranging from 1880 MHz to 1920 MHz, the range being the transmission band. The improvement regarding the insertion loss is assumed to be due to reduction in exothermic energy caused by electrode finger resistance due to the current distribution becoming more symmetrical and the current being prevented from concentrating to one or some of comb electrodes.

In FIG. 5, the amplitude balance gets better as it nears zero. It can be seen that the amplitude balance of the elastic wave device according to the present exemplary embodiment is better than that of the elastic wave device of the comparative example particularly at the lower part of the transmission band ranging from 1880 MHz to 1920 MHz.

In FIG. 6, the phase balance gets better as it nears zero. As shown in FIG. 6, there is no significant difference in the phase balance of the elastic wave device according to the present exemplary embodiment and the phase balance of the elastic wave device of the comparative example.

FIG. 7 is a characteristic diagram showing a common mode characteristic curve for comprehensively evaluating the amplitude balance and the phase balance, and shows that the greater the attenuation, the better the balance. It can be seen that the balance in the transmission band is better with the common mode characteristics of the elastic wave device according to the present exemplary embodiment in comparison to the common mode characteristics of the elastic wave device of the comparative example, and the balance is better because the influence of the improvement in the amplitude balance is dominant.

Figure 14:
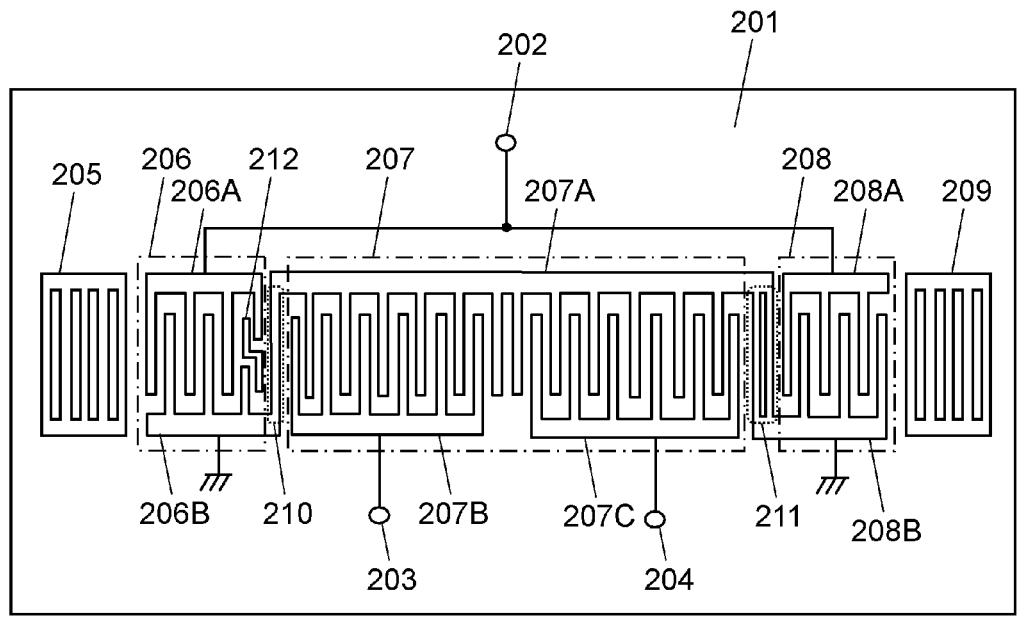
FIG. 14 is a plan view of a conventional elastic wave device.

FIG. 14 is a plan view of an elastic wave device according to a conventional technique. This elastic wave device is a three-electrode longitudinally coupled elastic wave filter having an unbalanced-to-balanced function. In this elastic wave device, reflector 205, first comb electrode pair 206 to third comb electrode pair 208, and reflector 209 are arranged in this order on a main surface of piezoelectric substrate 201 along the propagation direction of an elastic wave. First comb electrode pair 206 and third comb electrode pair 208 are connected to common unbalanced signal terminal 202. One comb electrode of second comb electrode pair 207 is formed from segmented comb electrodes 207B and 207C. Segmented comb electrodes 207B and 207C are connected to first balanced signal terminal 203 and second balanced signal terminal 204, respectively. Ground comb electrode 206B of first comb electrode pair 206 and ground comb electrode 207A of second comb electrode pair 207 are connected by one connection electrode finger 210, and ground comb electrode 207A of second comb electrode pair 207 and ground comb electrode 208B of third comb electrode pair 208 are connected by two connection electrode fingers 211. First comb electrode pair 206 is provided with dummy electrode finger 212 for improving the balance, and is weighted.

However, this elastic wave device of the conventional technique is a three-electrode type. Accordingly, the distance between closest electrode fingers of comb electrode 206A and comb electrode 207B and the distance between closest electrode fingers of comb electrode 208A and comb electrode 207C are different. Comb electrode 206A is connected to unbalanced signal terminal 202, and comb electrode 207B is connected to balanced signal terminal 203. Comb electrode 208A is connected to unbalanced signal terminal 202, and comb electrode 207C is connected to balanced signal terminal 204. This is to cause phases of a signal transmitted from unbalanced signal terminal 202 to balanced signal terminal 203 and a signal transmitted from unbalanced signal terminal 202 to balanced signal terminal 204 to be opposite each other. Since the distances are different as thus described, the displacement distribution becomes asymmetrical. As a result, the balance is degraded, and sufficient balance is not obtained even if connection electrode finger 211 or dummy electrode finger 212 is provided.

Such a difference for the three-electrode elastic wave device as shown in FIG. 14, which is known as a conventional technique, is assumed to result from a fundamental difference in the symmetry of a three-electrode type and a five-electrode type and the difference in the influence from electrode finger resistance.

In contrast, the elastic wave device according to the present exemplary embodiment is a five-electrode type. Accordingly, the average of the distance between signal comb electrode 306A and signal comb electrode 307B and the distance between signal comb electrode 308A and signal comb electrode 307B, and the average of the distance between signal comb electrode 310A and signal comb electrode 309B and the distance between signal comb electrode 308A and signal comb electrode 309B may be designed to be approximately the same. Signal comb electrode 306A is connected to unbalanced signal terminal 302, and signal comb electrode 307B is connected to first balanced signal terminal 303. Signal comb electrode 308A is connected to unbalanced signal terminal 302, and signal comb electrode 307B is connected to first balanced signal terminal 303. Signal comb electrode 310A is connected to unbalanced signal terminal 302, and signal comb electrode 309B is connected to second balanced signal terminal 304. Signal comb electrode 308A is connected to unbalanced signal terminal 302, and signal comb electrode 309B is connected to second balanced signal terminal 304.

Accordingly, parasitic capacitances which disturb the balance are approximately the same, and the symmetry is increased. In addition, when designed to have the same impedance, an aperture length of opposing comb electrodes of the five-electrode type is about half of that of the three-electrode type, thus the comb electrode resistance for the five-electrode type is small, and it is assumed that an effect of causing the potential to be the same for the ground comb electrodes by a connection electrode finger can be easily achieved. The symmetry of the displacement distribution of elastic wave is increased due to such reasons, and the distribution of current flowing through a comb electrode pair is thereby improved, leading to improvement in the balance and insertion loss. Accordingly, these effects are achieved because the present exemplary embodiment is of a five-electrode type.

Furthermore, as shown in FIG. 2, in the elastic wave device according to the present exemplary embodiment, the electrode finger pitches are symmetrical with respect to the center of third comb electrode pair 308 along the propagation direction, and the number of electrode fingers is also symmetrical with respect to the center. In other words, compared with an asymmetrical design, substantial design parameters may be reduced and designing is facilitated.

In order to obtain desirable electrical characteristics, it is important that processing is performed such that the comb electrode has a dimension as designed. However, if another conventional technique of causing electrode finger pitches at narrow pitch portions to be left-right asymmetrical is to be applied to a five-electrode elastic wave device, it is difficult to fabricate the electrode finger pitch as designed. That is, a mask has to be manufactured many times. In contrast, with the elastic wave device according to the present exemplary embodiment, the pitches at narrow pitch portions of first comb electrode pair 306 and second comb electrode pair 307 and the pitches at narrow pitch portions of fourth comb electrode pair 309 and fifth comb electrode pair 310 may be made the same. Also, the pitches at narrow pitch portions of second comb electrode pair 307 and third comb electrode pair 308 and the pitches at narrow pitch portions of third comb electrode pair 308 and fourth comb electrode pair 309 may be made the same. Therefore, even if the number of times of manufacturing the mask is small, a comb electrode dimension may be easily formed as designed and desirable electrical characteristics may be obtained.

In the elastic wave device according to the present exemplary embodiment, piezoelectric substrate 301 is a rotated Y-cut X-propagation lithium tantalite, but the present invention is not limited thereto, and the same effect may be achieved with other piezoelectric substrates.

To obtain desirable attenuation characteristics, a resonator may be connected to unbalanced signal terminal 302 shown in FIG. 1, or resonators of the same capacitance may be connected to first balanced signal terminal 303 and second balanced signal terminal 304, respectively.

The structure according to the present exemplary embodiment is characteristic in that the balance is good over a comparatively wide band, and good performance is achieved as a filter with a large proportion of a frequency range of the transmission band with respect to a center frequency, that is, a filter whose fractional bandwidth is 2.5% or more.

Second Exemplary Embodiment

Figure 8:
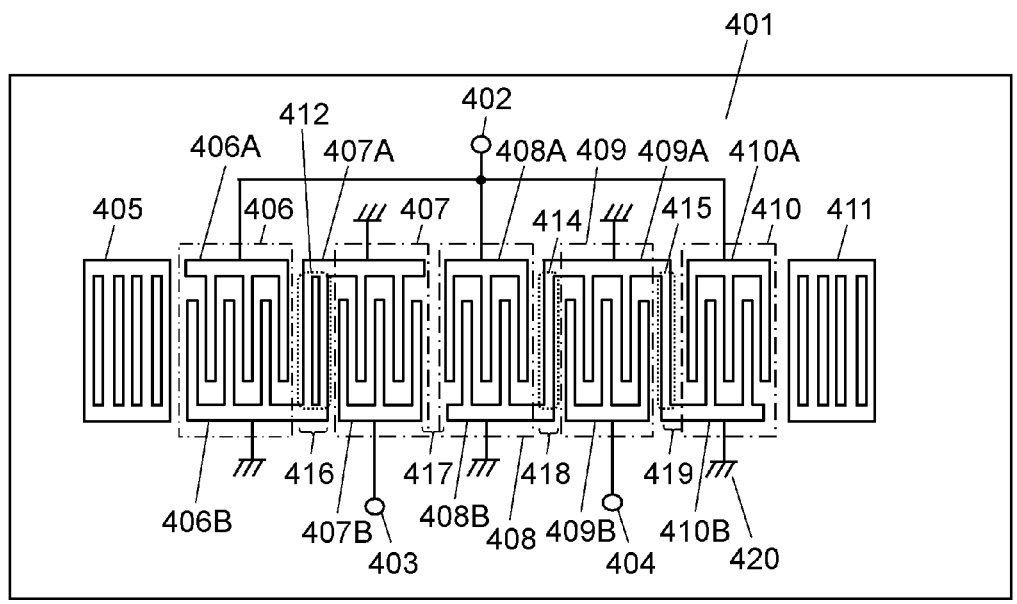
FIG. 8 is a plan view of an elastic wave device of a second exemplary embodiment of the present invention.

FIG. 8 is a plan view of an elastic wave device according to a second exemplary embodiment of the present invention. This elastic wave device includes piezoelectric substrate 401, reflector 405, first comb electrode pair 406, second comb electrode pair 407, third comb electrode pair 408, fourth comb electrode pair 409, fifth comb electrode pair 410, and reflector 411. Reflector 405, first comb electrode pair 406, second comb electrode pair 407, third comb electrode pair 408, fourth comb electrode pair 409, fifth comb electrode pair 410, and reflector 411 are arranged in this order on a main surface of piezoelectric substrate 401.

Signal comb electrode 406A of first comb electrode pair 406, signal comb electrode 408A of third comb electrode pair 408, and signal comb electrode 410A of fifth comb electrode pair 410 are connected in parallel, and also connected to unbalanced signal terminal 402. Signal comb electrode 407B of second comb electrode pair 407 is connected to first balanced signal terminal 403, and signal comb electrode 409B of fourth comb electrode pair 409 is connected to second balanced signal terminal 404. Ground comb electrode 406B of first comb electrode pair 406, ground comb electrode 408B of third comb electrode pair 408, and ground comb electrode 410B of fifth comb electrode pair 410 are connected to ground electrode 420. Ground comb electrode 407A of second comb electrode pair 407 and ground comb electrode 409A of fourth comb electrode pair 409 are also connected to ground electrode 420.

At first adjacence portion 416 where ground comb electrode 406B and ground comb electrode 407A are adjacent to each other, two connection electrode fingers 412 electrically connecting ground comb electrode 406B to ground comb electrode 407A are provided. At second adjacence portion 417 where ground comb electrode 407A and ground comb electrode 408B are adjacent to each other, a connection electrode finger for electrically connecting ground comb electrode 407A to ground comb electrode 408B is not provided. At third adjacence portion 418 where ground comb electrode 408B and ground comb electrode 409A are adjacent to each other, one connection electrode finger 414 electrically connecting ground comb electrode 408B to ground comb electrode 409A is provided. At fourth adjacence portion 419 where ground comb electrode 409A and ground comb electrode 410B are adjacent to each other, one connection electrode finger 415 electrically connecting ground comb electrode 409A to ground comb electrode 410B is provided.

With the structure described above, the left-right asymmetry of displacement distribution of excited elastic wave can be reduced, and as a result, the symmetry of distribution of current flowing through the comb electrode is increased. A good balance is thereby obtained for the elastic wave device. As a result, the insertion loss of the elastic wave device is reduced.

The structure according to the present exemplary embodiment is characteristic in that the balance is good over a comparatively wide band, and a good performance is achieved as a filter with a large proportion of a frequency range of the transmission band with respect to a center frequency, that is, a filter whose fractional bandwidth is 2.5% or more.

Third Exemplary Embodiment

Figure 9:
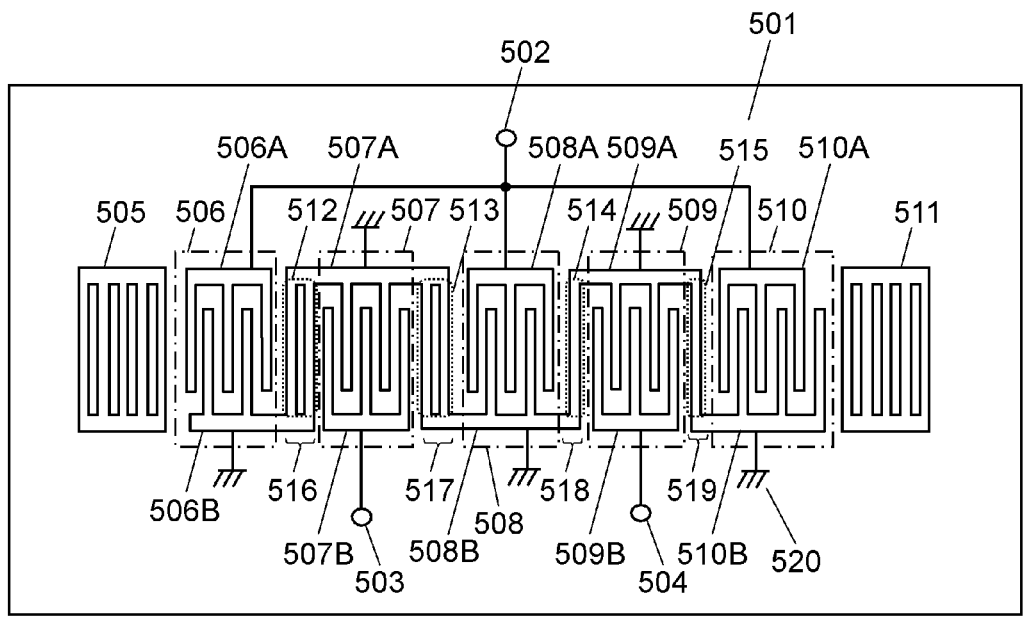
FIG. 9 is a plan view of an elastic wave device of a third exemplary embodiment of the present invention.

FIG. 9 is a plan view of an elastic wave device according to a third exemplary embodiment of the present invention. This elastic wave device includes piezoelectric substrate 501, reflector 505, first comb electrode pair 506, second comb electrode pair 507, third comb electrode pair 508, fourth comb electrode pair 509, fifth comb electrode pair 510, and reflector 511. Reflector 505, first comb electrode pair 506, second comb electrode pair 507, third comb electrode pair 508, fourth comb electrode pair 509, fifth comb electrode pair 510, and reflector 511 are arranged in this order on a main surface of piezoelectric substrate 501.

Signal comb electrode 506A of first comb electrode pair 506, signal comb electrode 508A of third comb electrode pair 508, and signal comb electrode 510A of fifth comb electrode pair 510 are connected in parallel, and also connected to unbalanced signal terminal 502. Signal comb electrode 507B of second comb electrode pair 507 is connected to first balanced signal terminal 503, and signal comb electrode 509B of fourth comb electrode pair 509 is connected to second balanced signal terminal 504. Ground comb electrode 506B of first comb electrode pair 506, ground comb electrode 508B of third comb electrode pair 508, and ground comb electrode 510B of fifth comb electrode pair 510 are connected to ground electrode 520. Ground comb electrode 507A of second comb electrode pair 507 and ground comb electrode 509A of fourth comb electrode pair 509 are also connected to ground electrode 520.

At first adjacence portion 516 where first comb electrode pair 506 and second comb electrode pair 507 are adjacent to each other, ground comb electrode 506B and ground comb electrode 507A are electrically connected by two connection electrode fingers 512. At second adjacence portion 517 where second comb electrode pair 507 and third comb electrode pair 508 are adjacent to each other, ground comb electrode 507A and ground comb electrode 508B are electrically connected by two connection electrode fingers 513. At third adjacence portion 518 where third comb electrode pair 508 and fourth comb electrode pair 509 are adjacent to each other, ground comb electrode 508B and ground comb electrode 509A are electrically connected by one connection electrode finger 514. At fourth adjacence portion 519 where fourth comb electrode pair 509 and fifth comb electrode pair 510 are adjacent to each other, ground comb electrode 509A and ground comb electrode 510B are electrically connected by one connection electrode finger 515. With this structure, an elastic wave device with a good balance may be obtained.

Figure 10:
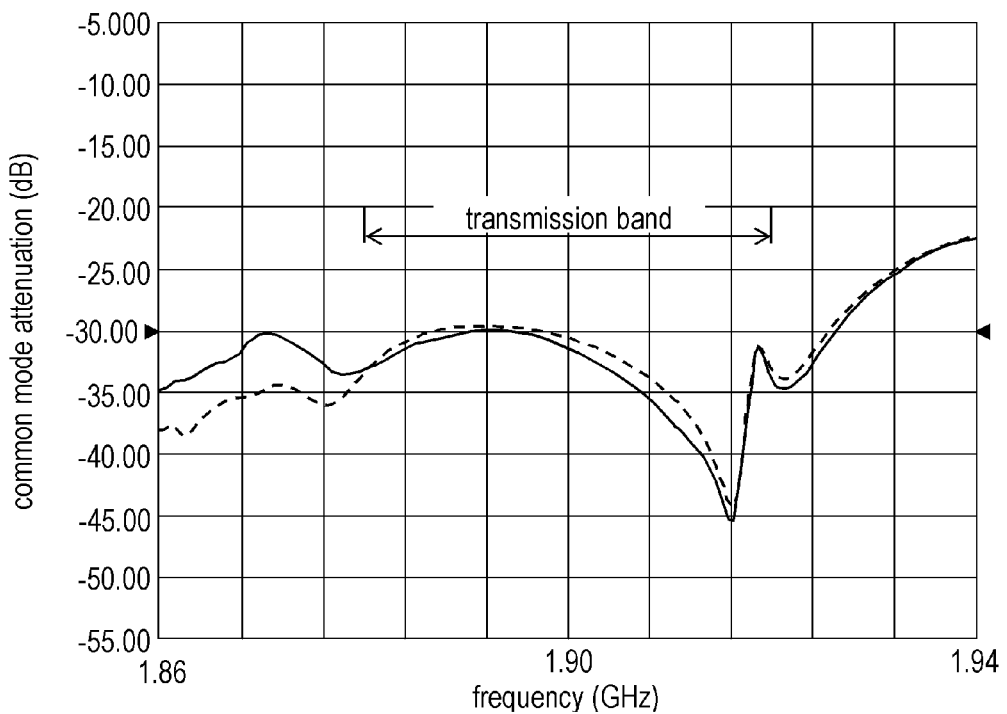
FIG. 10 is a diagram showing a common mode characteristic curve of the elastic wave device shown in FIG. 9.

Now, the common mode characteristic curve of the elastic wave device according to the present exemplary embodiment is shown in FIG. 10. The solid line is the common mode characteristic curve of the elastic wave device according to the present exemplary embodiment, and the broken line is that of the elastic wave device of the comparative example described in the first exemplary embodiment. The number of comb electrodes and the electrode finger pitches are the same for the elastic wave device according to the present exemplary embodiment and the elastic wave device of the comparative example.

It can be seen from FIG. 10 that the elastic wave device according to the present exemplary embodiment has an improved balance with respect to the frequency within the transmission band. As compared with the first exemplary embodiment, the balance is further improved at a specific frequency range, and a good performance is achieved as a filter with a small proportion of a frequency range of the transmission band with respect to a center frequency, that is, a filter whose fractional bandwidth is 2.5% or less.

Fourth Exemplary Embodiment

Figure 11:
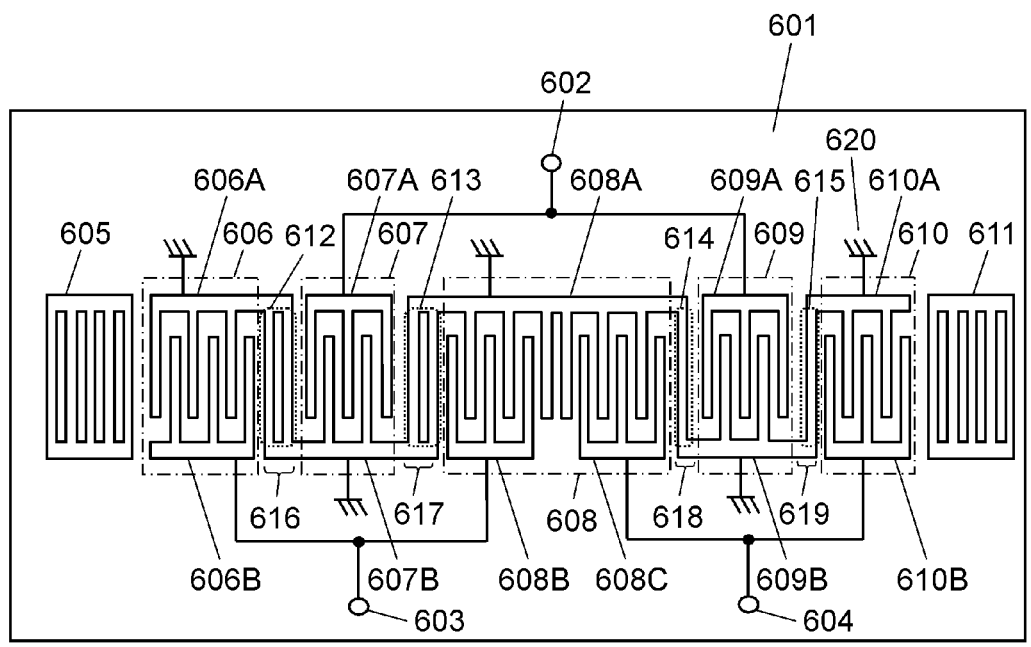
FIG. 11 is a plan view of an elastic wave device of a fourth exemplary embodiment of the present invention.

FIG. 11 is a plan view of an elastic wave device according to a fourth exemplary embodiment of the present invention. This elastic wave device includes piezoelectric substrate 601, reflector 605, first comb electrode pair 606, second comb electrode pair 607, third comb electrode pair 608, fourth comb electrode pair 609, fifth comb electrode pair 610, and reflector 611. Reflector 605, first comb electrode pair 606, second comb electrode pair 607, third comb electrode pair 608, fourth comb electrode pair 609, fifth comb electrode pair 610, and reflector 611 are arranged in this order on a main surface of piezoelectric substrate 601. That is, reflectors 605 and 611 are disposed on piezoelectric substrate 601 along the propagation direction of an elastic wave, and first comb electrode pair 606 to fifth comb electrode pair 610 are arranged in this order between reflectors 605 and 611.

Third comb electrode pair 608 is divided into two regions in the propagation direction of an elastic wave. That is, in third comb electrode pair 608, portions of grand comb electrode 608A in a first region and in a second region are electrically connected in series to each other with a series connection point.

Signal comb electrode 607A of second comb electrode pair 607 and signal comb electrode 609A of fourth comb electrode pair 609 are connected in parallel, and also connected to unbalanced signal terminal 602. Signal comb electrode 606B of first comb electrode pair 606 is connected in parallel to signal comb electrode 608B, and is connected to first balanced signal terminal 603. Signal comb electrode 610B of fifth comb electrode pair 610 is connected in parallel to signal comb electrode 608C, and is connected to second balanced signal terminal 604. Ground comb electrode 606A of first comb electrode pair 606, ground comb electrode 608A of third comb electrode pair 608 and ground comb electrode 610A of fifth comb electrode pair 610 are connected to ground electrode 620. Ground comb electrode 607B of second comb electrode pair 607, and ground comb electrode 609B of fourth comb electrode pair 609 are also connected to ground electrode 620.

Moreover, at first adjacence portion 616 where first comb electrode pair 606 and second comb electrode pair 607 are adjacent to each other, two connection electrode fingers 612 electrically connecting ground comb electrode 606A to ground comb electrode 607B are provided. At second adjacence portion 617 where second comb electrode pair 607 and third comb electrode pair 608 are adjacent to each other, two connection electrode fingers 613 electrically connecting ground comb electrode 607B to ground comb electrode 608A are provided. At third adjacence portion 618 where third comb electrode pair 608 and fourth comb electrode pair 609 are adjacent to each other, one connection electrode finger 614 electrically connecting ground comb electrode 608A to ground comb electrode 609B is provided. At fourth adjacence portion 619 where fourth comb electrode pair 609 and fifth comb electrode pair 610 are adjacent to each other, one connection electrode finger 615 electrically connecting ground comb electrode 609B to ground comb electrode 610A is provided. With the structure described above, a good balance can be realized for the elastic wave device with impedance different from those of the first to third exemplary embodiments.

Hereinafter, the design values of the elastic wave device according to the present exemplary embodiment are shown. The transmission band ranges from 1930 MHz and 1990 MHz, piezoelectric substrate 601 is a rotated Y-cut X-propagation lithium tantalate single crystal, and the number of electrode fingers is 50 for reflector 605, 38 (19 pairs) for first comb electrode pair 606, 38 (19 pairs) for second comb electrode pair 607, 136 (68 pairs) for third comb electrode pair 608, 38 (19 pairs) for fourth comb electrode pair 609, 38 (19 pairs) for fifth comb electrode pair 610, and 50 for reflector 611. In third comb electrode pair 608, the number of electrode fingers is the same for signal comb electrode 608B and signal comb electrode 608C.

Figure 12:
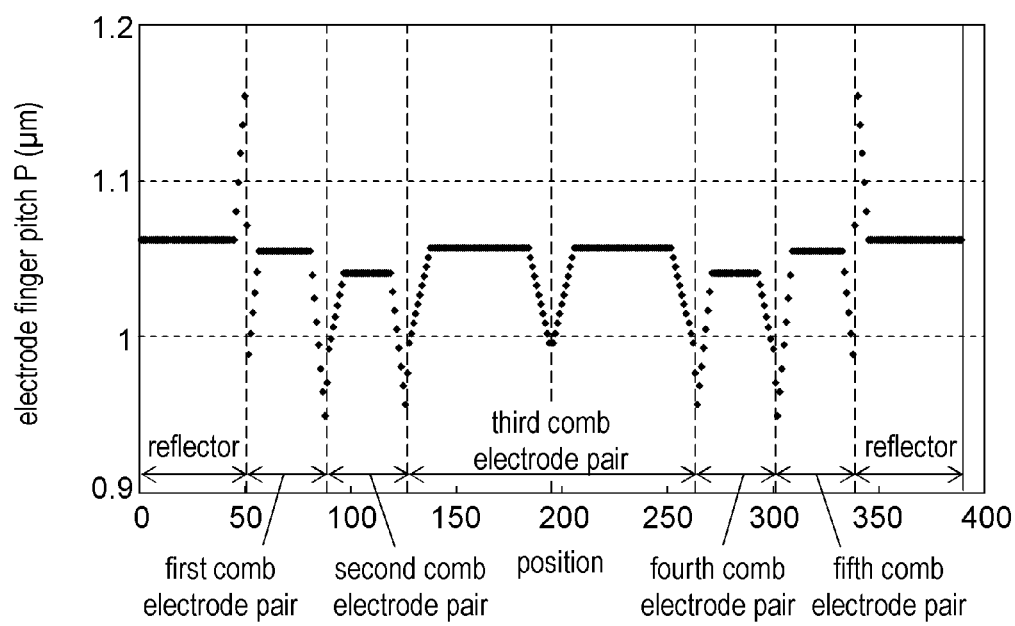
FIG. 12 is a distribution diagram of electrode finger pitches of the elastic wave device shown in FIG. 11.

As shown in FIG. 12, the electrode finger pitches are preferably line symmetrical with respect to the center of third comb electrode pair 608. That is, the electrode finger pitches of first comb electrode pair 606 to fifth comb electrode pair 610 are preferably line symmetrical in a the propagation direction of an elastic wave with respect to the center of third comb electrode pair 608 as an axis.

The electrode finger pitches of equal pitch portions of reflectors 605 and 611 are 1.0621 m, the electrode finger pitches of equal pitch portions of first comb electrode pair 606 and fifth comb electrode pair 610 are 1.0550 µm, the electrode finger pitches of equal pitch portions of second comb electrode pair 607 and fourth comb electrode pair 609 are 1.0407 µm, and the electrode finger pitches of equal pitch portions of third comb electrode pair 608 are 1.0571 µm.

The electrode finger pitches of first adjacence portion 616 are varied such that the minimum electrode finger pitch is 0.9495 µm. The electrode finger pitches of second adjacence portion 617 are varied such that the minimum electrode finger pitch is 0.9566 µm. The electrode finger pitches of third adjacence portion 618 are structured to be symmetrical to those of second adjacence portion 617, and the electrode finger pitches of fourth adjacence portion 619 are structured to be symmetrical to those of first adjacence portion 616. The electrode finger pitches of an adjacence portion of the first region and the second region of third comb electrode pair 608 are varied such that the minimum electrode finger pitch is 0.9965 μm.

At the adjacence portion of reflector 605 and first comb electrode pair 606, the electrode finger pitches of reflector 605 are varied so as to become gradually larger toward the adjacence portion, and the electrode finger pitches of first comb electrode pair 606 are varied so as to become gradually smaller toward the adjacence portion. At the adjacence portion of reflector 611 and fifth comb electrode pair 610, the electrode finger pitches of reflector 611 are varied so as to become gradually larger toward the adjacence portion, and the electrode finger pitches of fifth comb electrode pair 610 are varied so as to become gradually smaller toward the adjacence portion. With this structure, steep attenuation characteristics may be obtained at a lower part of the transmission band.

With the structure described above, an elastic wave device with a good balance where the amplitude balance is 0.7 dB or less and the phase balance is 5° or less in a transmission band ranging from 1930 MHz to 1990 MHz may be obtained.

Note that, in the description above, both first connection electrode finger 612 and second connection electrode finger 613 are provided, but it is also possible to provide only one of first connection electrode finger 612 and second connection electrode finger 613. It is also possible to provide only one of third connection electrode finger 614 and fourth connection electrode finger 615. That is, second connection electrode finger 613 may be formed from two electrode fingers without providing first connection electrode finger 612, and third and fourth connection electrode fingers 614 and 615 may be formed from one electrode finger. Alternatively, first connection electrode finger 612 may be formed from two electrode fingers without providing second connection electrode finger 613, and third and fourth connection electrode fingers 614 and 615 may be formed from one electrode finger.

In the first to fourth exemplary embodiments, the number of electrode fingers is an even number for the first to fifth comb electrode pairs, but the present invention is not limited thereto, and the number of electrode fingers may also be an odd number.

The combination of the number of connection electrode fingers at each of the first to fourth adjacence portions may be other than those described in the first to fourth exemplary embodiments, such as two for the first adjacence portion, two for the second adjacence portion, one for the third adjacence portion, and three for the fourth adjacence portion. That is, it is sufficient if at least one of the first connection electrode finger and the second connection electrode finger is formed from an even number of electrode fingers, and at least one of the third connection electrode finger and the fourth connection electrode finger is formed from an odd number of electrode fingers.

Furthermore, in the first to fourth exemplary embodiments, both the third connection electrode finger and the fourth connection electrode finger are provided, but it is possible to provide only one of the third connection electrode finger and the fourth connection electrode finger.

An elastic wave device having first to fifth comb electrode pairs is shown in the first to fourth exemplary embodiments, but the same effect can be expected with an elastic wave device having a greater number of comb electrode pairs.

INDUSTRIAL APPLICABILITY

With the elastic wave device according to the present invention, there is achieved an excellent effect that a small elastic wave device with a low loss and a good balance is easily obtained. This elastic wave device is useful mainly as an elastic wave filter used in a mobile communication device or the like.

The invention claimed is:

1. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;
at least one of a first connection electrode finger connecting the ground comb electrode of the first comb electrode pair to the ground comb electrode of the second comb electrode pair and a second connection electrode finger connecting the ground comb electrode of the second comb electrode pair to the ground comb electrode of the third comb electrode pair; and
at least one of a third connection electrode finger connecting the ground comb electrode of the third comb electrode pair to the ground comb electrode of the fourth comb electrode pair and a fourth connection electrode finger connecting the ground comb electrode of the fourth comb electrode pair to the ground comb electrode of the fifth comb electrode pair;
electrode finger pitches of the first to fifth comb electrode pairs being line symmetrical in the propagation direction with respect to a center of the third comb electrode pair as an axis.

2. An elastic wave device comprising:
a piezoelectric substrate;
an unbalanced signal terminal for receiving an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent to one another in order between the pair of reflectors, each of the first to fifth comb electrode pairs having a signal comb electrode and a ground comb electrode facing each other;
a first connection electrode finger connecting the ground comb electrode of the first comb electrode pair to the ground comb electrode of the second comb electrode pair at a first adjacent portion where the first comb electrode pair and the second comb electrode pair are adjacent to each other;
a second connection electrode finger connecting the ground comb electrode of the second comb electrode pair to the ground comb electrode of the third comb electrode pair;
a third connection electrode finger connecting the ground comb electrode of the third comb electrode pair to the ground comb electrode of the fourth comb electrode pair; and a fourth connection electrode finger connecting the ground comb electrode of the fourth comb electrode pair to the ground comb electrode of the fifth comb electrode pair.

3. The elastic wave device of claim 2 wherein at least one of the first connection electrode finger and the second connection electrode finger have an even number of electrode fingers, and at least one of the third connection electrode finger and the fourth connection electrode finger have an odd number of electrode fingers.

4. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;
two connection electrode fingers connecting the ground comb electrode of the second comb electrode pair to the ground comb electrode of the third comb electrode pair; and
at least one of a third connection electrode finger connecting the ground comb electrode of the third comb electrode pair to the ground comb electrode of the fourth comb electrode pair and a fourth connection electrode finger connecting the ground comb electrode of the fourth comb electrode pair to the ground comb electrode of the fifth comb electrode pair.

5. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;
at least one of a first connection electrode finger connecting the ground comb electrode of the first comb electrode pair to the ground comb electrode of the second comb electrode pair and a second connection electrode finger connecting the ground comb electrode of the second comb electrode pair to the ground comb electrode of the third comb electrode pair; and
at least one of a third connection electrode finger connecting the ground comb electrode of the third comb electrode pair to the ground comb electrode of the fourth comb electrode pair and a fourth connection electrode finger connecting the ground comb electrode of the fourth comb electrode pair to the ground comb electrode of the fifth comb electrode pair;
a total number of electrode fingers of the first connection electrode finger and the second connection electrode finger being equal to a total number of electrode fingers of the third connection electrode finger and the fourth connection electrode finger.

6. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;
at least one of a first connection electrode finger connecting the ground comb electrode of the first comb electrode pair to the ground comb electrode of the second comb electrode pair and a second connection electrode finger connecting the ground comb electrode of the second comb electrode pair to the ground comb electrode of the third comb electrode pair; and
a third connection electrode finger and a fourth connection electrode finger, the third connection electrode finger connecting the ground comb electrode of the third comb electrode pair to the ground comb electrode of the fourth comb electrode pair, and the fourth connection electrode finger having a single electrode finger and connecting the ground comb electrode of the fourth comb electrode pair to the ground comb electrode of the fifth comb electrode pair.

7. An elastic wave device comprising:
a piezoelectric substrate;
an unbalanced signal terminal for receiving an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent to one another in order between the pair of reflectors, each of the first to fifth comb electrode pairs having a signal comb electrode and a ground comb electrode facing each other, the signal comb electrode of the second comb electrode pair and the signal comb electrode of the fourth comb electrode pair connected together in parallel and connected to the unbalanced signal terminal, the third comb electrode pair divided into a first region and a second region along the propagation direction, a ground comb electrode of the first region and a ground comb electrode of the second region electrically connected together in series, a signal comb electrode of the first region connected in parallel to the signal comb electrode of the first comb electrode pair and connected to the first balanced signal terminal, a signal comb electrode of the second region connected in parallel to the signal comb electrode of the fifth comb electrode pair and connected to the second balanced signal terminal;
at least one of a first connection electrode finger connecting the ground comb electrode of the first comb electrode pair to the ground comb electrode of the second comb electrode pair and a second connection electrode finger connecting the ground comb electrode of the second comb electrode pair to the ground comb electrode of the third comb electrode pair; and at least one of a third connection electrode finger connecting the ground comb electrode of the third comb electrode pair to the ground comb electrode of the fourth comb electrode pair and a fourth connection electrode finger connecting the ground comb electrode of the fourth comb electrode pair to the ground comb electrode of the fifth comb electrode pair.

8. The elastic wave device of claim 7 wherein the second connection electrode finger has two electrode fingers, the third connection electrode finger has one electrode finger, and the fourth connection electrode finger has one electrode finger.

9. The elastic wave device of claim 7 wherein electrode finger pitches of the first to fifth comb electrode pairs are provided to be line symmetrical in the propagation direction with respect to a center of the third comb electrode pair as an axis.

10. The elastic wave device of claim 7 wherein the first connection electrode finger has two electrode fingers, the second connection electrode finger has two electrode fingers, the third connection electrode finger has one electrode finger, and the fourth connection electrode finger has one electrode finger.

11. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;
two connection electrode fingers connecting the ground comb electrode of the first comb electrode pair to the ground comb electrode of the second comb electrode pair; and
a third connection electrode finger and a fourth connection electrode finger, the third connection electrode finger connecting the ground comb electrode of the third comb electrode pair to the ground comb electrode of the fourth comb electrode pair, and the fourth connection electrode finger having a single electrode finger and connecting the ground comb electrode of the fourth comb electrode pair to the ground comb electrode of the fifth comb electrode pair.

12. An elastic wave device comprising:
a piezoelectric substrate;
an unbalanced signal terminal to receive an unbalanced signal;
a first balanced signal terminal to provide a first balanced signal and a second balanced signal terminal to provide a second balanced signal;
a pair of reflectors disposed on the piezoelectric substrate along a propagation direction of an elastic wave through the elastic wave device;
first to fifth comb electrode pairs disposed adjacent one another in order between the pair of reflectors, each of the first to fifth comb electrode pairs having a signal comb electrode and a ground comb electrode facing each other;

at least one of a first connection electrode finger connecting the ground comb electrode of the first comb electrode pair to the ground comb electrode of the second comb electrode pair and a second connection electrode finger connecting the ground comb electrode of the second comb electrode pair to the ground comb electrode of the third comb electrode pair; and at least one of a third connection electrode finger connecting the ground comb electrode of the third comb electrode pair to the ground comb electrode of the fourth comb electrode pair and a fourth connection electrode finger connecting the ground comb electrode of the fourth comb electrode pair to the ground comb electrode of the fifth comb electrode pair;

the signal comb electrode of the first comb electrode pair, the signal comb electrode of the third comb electrode pair, and the signal comb electrode of the fifth comb electrode pair being connected together in parallel and to the unbalanced signal terminal, the signal comb electrode of the second comb electrode pair being connected to the first balanced signal terminal, the signal comb electrode of the fourth comb electrode pair being connected to the second balanced signal terminal, and the ground comb electrodes of the first to fifth comb electrode pairs being connected to a ground electrode.

13. The elastic wave device of claim 12 wherein the first connection electrode finger has two electrode fingers and the third connection electrode finger has a single electrode finger.

14. The elastic wave device of claim 12 wherein the first connection electrode finger connects the ground comb electrode of the first comb electrode pair to the ground comb electrode of the second comb electrode pair at a first adjacent portion where the first comb electrode pair and the second comb electrode pair are adjacent to each other.

15. The elastic wave device of claim 14 wherein the second connection electrode finger connects the ground comb electrode of the second comb electrode pair to the ground comb electrode of the third comb electrode pair at a second adjacent portion where the second comb electrode pair and the third comb electrode pair are adjacent to each other.

16. The elastic wave device of claim 12 wherein the third connection electrode finger connects the ground comb electrode of the third comb electrode pair to the ground comb electrode of the fourth comb electrode pair at a third adjacent portion where the third comb electrode pair and the fourth comb electrode pair are adjacent to each other.

17. The elastic wave device of claim 16 wherein the fourth connection electrode finger connects the ground comb electrode of the fourth comb electrode pair to the ground comb electrode of the fifth comb electrode pair at a fourth adjacent portion where the fourth comb electrode pair and the fifth comb electrode pair are adjacent to each other.

18. The elastic wave filter of claim 12 wherein the at least one of the first connection electrode finger and the second connection electrode finger has an even number of electrode fingers, and the at least one of the third connection electrode finger and the fourth connection electrode finger has an odd number of electrode fingers.

19. The elastic wave device of claim 12 wherein the third connection electrode finger has a single electrode finger.

20. The elastic wave device of claim 12 wherein the first connection electrode finger has two electrode fingers.

21. The elastic wave filter device of claim 20 wherein the third connection electrode finger has a single electrode finger.

22. The elastic wave filter device of claim 20 wherein the fourth connection electrode finger has a single electrode finger.

23. The elastic wave filter device of claim 20 wherein the second connection electrode finger has two electrode fingers.

* * * * *